(12) United States Patent
Lochtefeld et al.

(10) Patent No.: US 9,178,105 B2
(45) Date of Patent: Nov. 3, 2015

(54) FLEXIBLE MONOCRYSTALLINE THIN SILICON CELL

(75) Inventors: Anthony Lochtefeld, Ipswich, MA (US); Chris Leitz, Watertown, MA (US)

(73) Assignee: Amberwave Inc., Salem, NH (US)

( * ) Notice: Subject to any disclaimer, the term of this patent is extended or adjusted under 35 U.S.C. 154(b) by 152 days.

(21) Appl. No.: 13/239,279

(22) Filed: Sep. 21, 2011

(65) Prior Publication Data

US 2012/0067423 A1 Mar. 22, 2012

Related U.S. Application Data

(60) Provisional application No. 61/384,782, filed on Sep. 21, 2010.

(51) Int. Cl.
| | |
|---|---|
| *H01L 21/30* | (2006.01) |
| *H01L 21/46* | (2006.01) |
| *H01L 31/18* | (2006.01) |
| *H01L 31/0747* | (2012.01) |
| *H01L 31/0392* | (2006.01) |
| *H01L 31/068* | (2012.01) |

(52) U.S. Cl.
CPC ...... *H01L 31/1896* (2013.01); *H01L 31/03921* (2013.01); *H01L 31/068* (2013.01); *H01L 31/0747* (2013.01); *Y02E 10/547* (2013.01)

(58) Field of Classification Search
CPC ............ H01L 31/1892; H01L 31/1896; H01L 31/0747; H01L 31/068; H01L 31/03921; H01L 21/2007; H01L 21/76254
USPC ........... 438/64, 66, 67, 98, 99, 455, 458, 459, 438/497, 977, 960, 761, 762, 763
See application file for complete search history.

(56) References Cited

U.S. PATENT DOCUMENTS

| | | | |
|---|---|---|---|
| 6,107,213 A * | 8/2000 | Tayanaka | 438/762 |
| 6,452,091 B1 * | 9/2002 | Nakagawa et al. | 136/261 |

* cited by examiner

*Primary Examiner* — Thanh Y Tran

(57) ABSTRACT

A device, system, and method for solar cell construction and layer transfer are disclosed herein. An exemplary method of solar cell construction involves providing a silicon donor substrate. A porous layer is formed on the donor substrate. A first portion of a solar cell is constructed on the porous layer of the donor substrate. The solar cell and donor substrate are bonded to a flexible substrate. The flexible substrate and the first portion of a solar cell are then separated from the donor substrate at the porous layer. A second portion of a solar cell may then be constructed on the first portion of a solar cell providing a single completed solar cell.

27 Claims, 37 Drawing Sheets

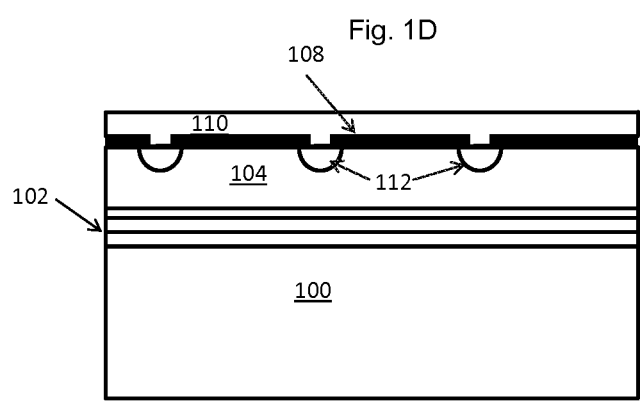

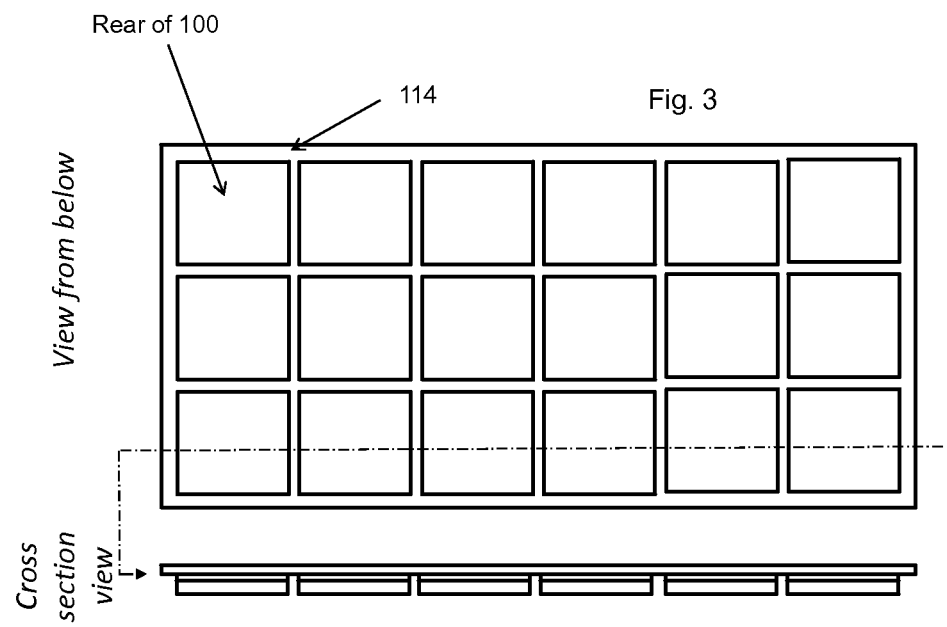

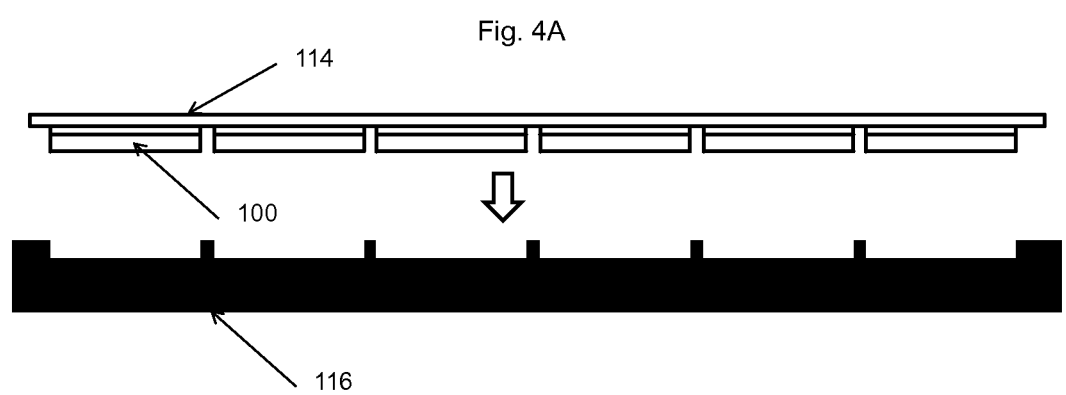

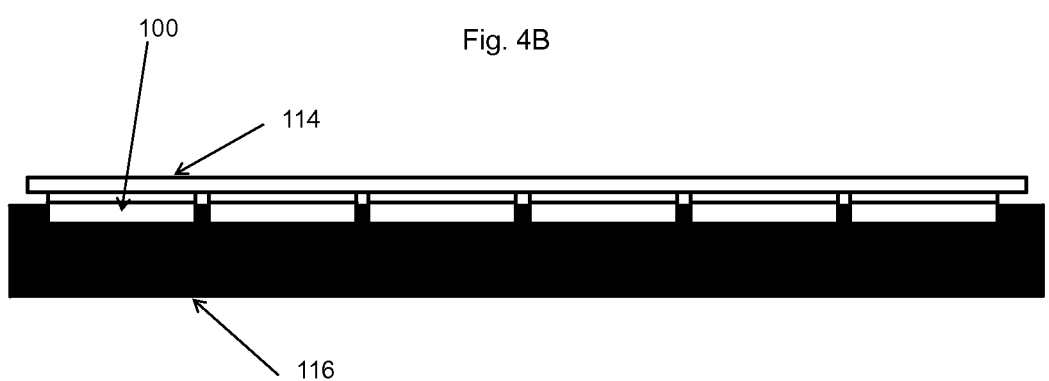

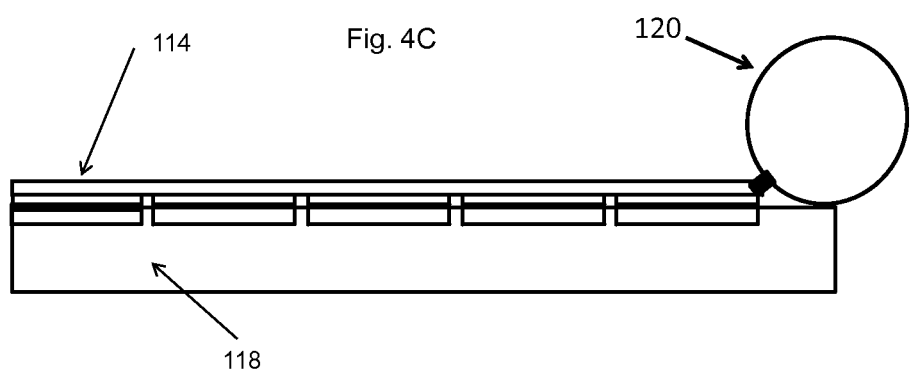

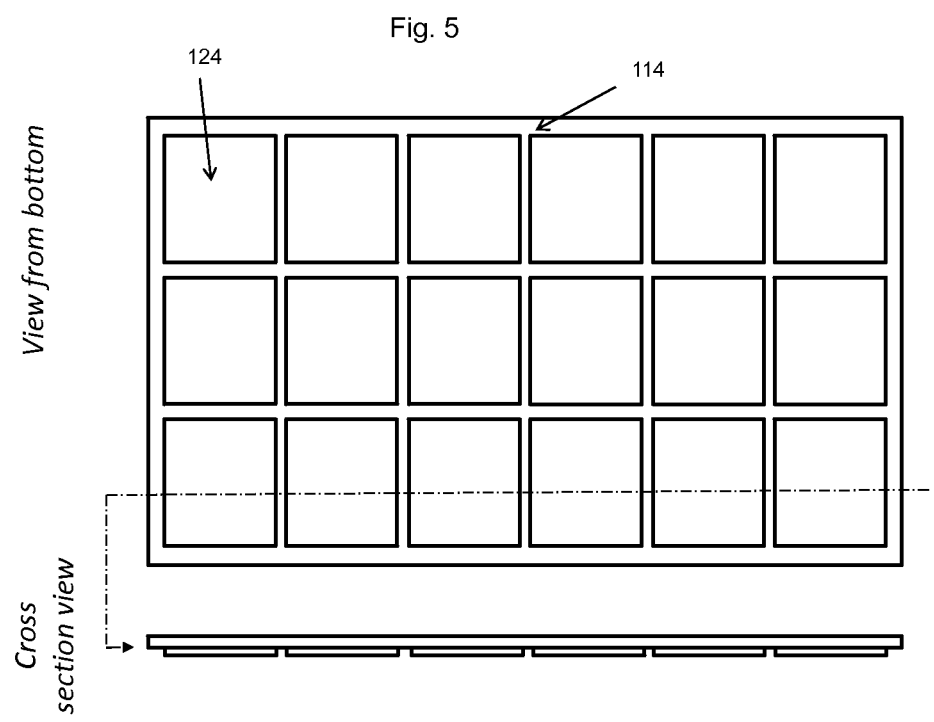

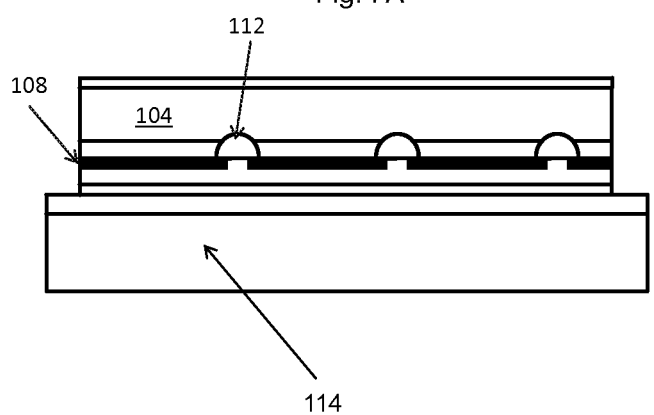

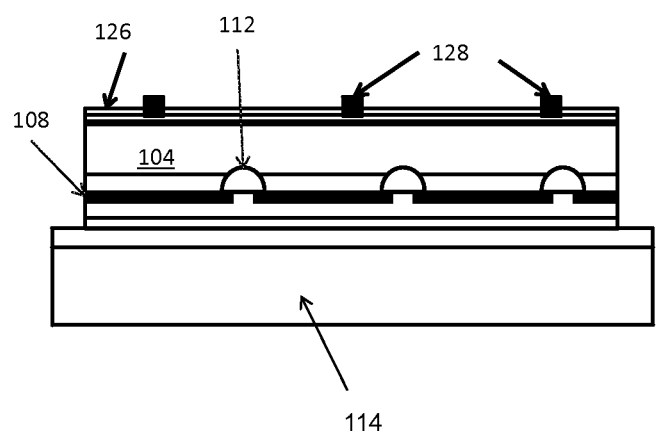

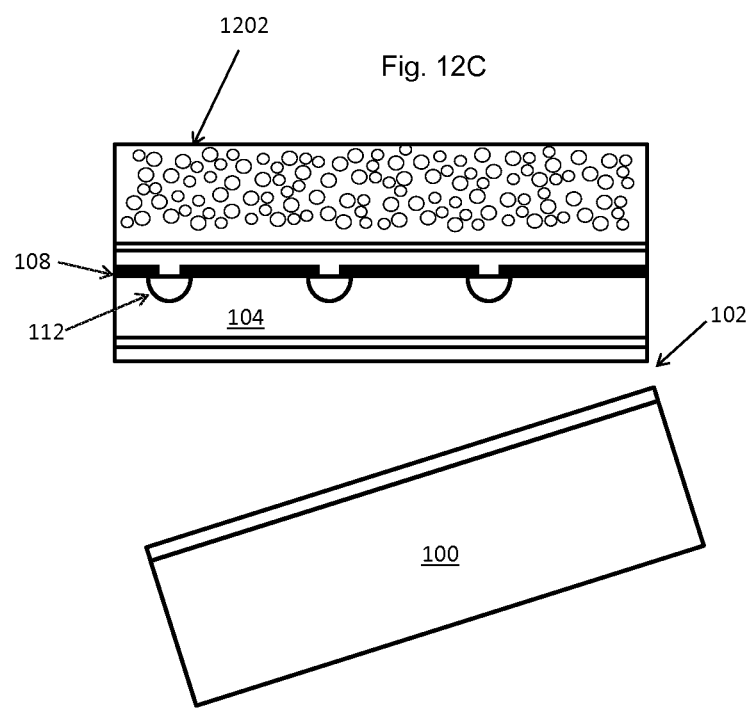

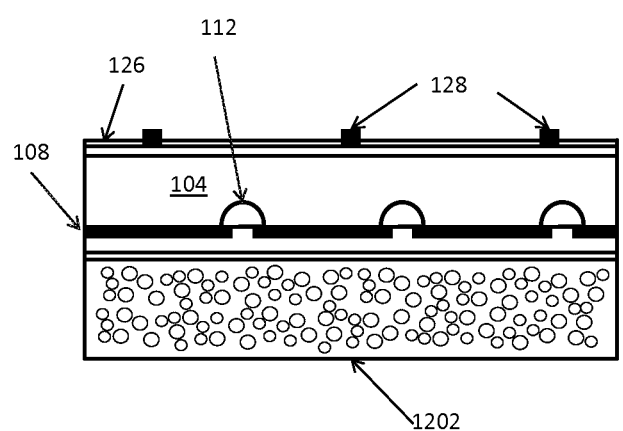

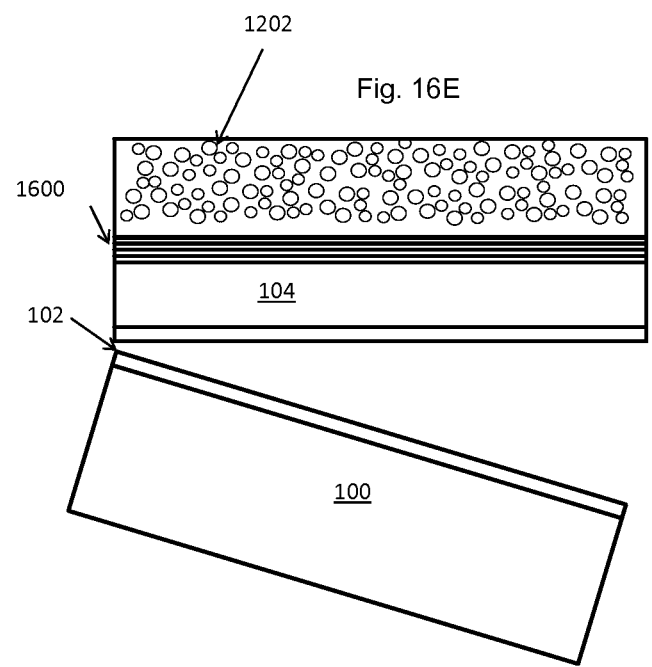

FLEXIBLE MONOCRYSTALLINE THIN SILICON CELL

RELATED APPLICATIONS

This application claims the benefit of and priority to U.S. Provisional Application Ser. No. 61/384,782 filed Sep. 21, 2010, the disclosures of which are hereby incorporated by reference in their entirety.

TECHNICAL FIELD

The present invention relates to layer transfer and more particularly, relates to layer transfer of thin film silicon cells onto a flexible substrate.

BACKGROUND INFORMATION

This invention relates generally to the construction of wafers and substrates used in the optoelectronic and electronic fields. In particular, it relates to a technique of wafer bonding and splitting to facilitate the transfer of thin film semiconductor materials used in making semiconductor substrates for solar cells, LEDs, LDs, optoelectronic integration circuits (OEIC) and microeletromechanical systems (MEMS).

SUMMARY

The present invention is a novel device, system, and method for a solar cell. An exemplary embodiment involves forming a porous layer on a donor substrate. A first portion of a solar cell is constructed on the porous layer of the donor substrate. The solar cell and donor substrate are bonded to a flexible substrate. The flexible substrate and the first portion of a solar cell are separated from the silicon donor substrate at the porous layer. A second portion of a solar cell is constructed on the first portion of a solar cell to provide a single complete solar cell.

Alternative embodiments may involve forming a porous layer on a silicon donor substrate. A first portion of a solar cell is constructed on the porous layer of the silicon donor substrate. A metal support film is plated on a surface of the solar cell. The metal support film and first portion of the solar cell are separated from the silicon donor substrate at the porous layer. A second portion of a solar cell is constructed on the first portion of a solar cell to provide a single complete solar cell.

The present invention is not intended to be limited to a system or method that must satisfy one or more of any stated objects or features of the invention. It is also important to note that the present invention is not limited to the exemplary or primary embodiments described herein. Modifications and substitutions by one of ordinary skill in the art are considered to be within the scope of the present invention, which is not to be limited except by the following claims.

BRIEF DESCRIPTION OF THE DRAWINGS

These and other features and advantages of the present invention will be better understood by reading the following detailed description, taken together with the drawings wherein:

FIGS. 1A-E are profile diagrams of a device constructed in accordance with an exemplary porous layer and flexible substrate embodiment of the invention.

FIG. 3 is a bottom and side view diagram of multiple completed devices prior to separation of the substrate constructed in accordance with the exemplary porous layer and flexible substrate embodiment of the invention.

FIGS. 4A-D are profile diagrams of the device utilizing various separations of the substrate in accordance with the exemplary porous layer and flexible substrate embodiment of the invention.

FIG. 5 is a bottom and side view diagram of flexible substrate subsequent to separation of the donor substrate in accordance with the exemplary porous layer and flexible substrate embodiment of the invention.

FIGS. 7A-B are profile diagrams of post-separation processing of the device in accordance with the exemplary porous layer and flexible substrate embodiment of the invention.

FIGS. 12A-D are profile diagrams of a device constructed in accordance with an exemplary metal/composite plated substrate embodiment of the invention.

FIGS. 16A-H are profile diagrams of a Heterojunction with Intrinsic Thin layer (HIT) solar device constructed in accordance with an exemplary HIT solar device with metal/composite plated substrate embodiment of the invention.

DETAILED DESCRIPTION OF THE PREFERRED EMBODIMENTS

Figure 1A:
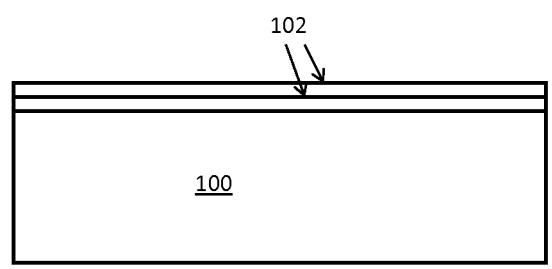
Figure 1B:
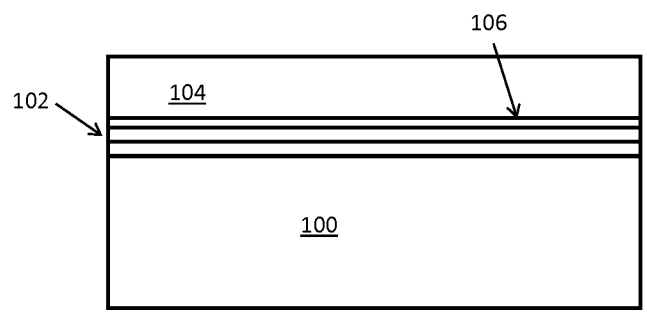
Figure 1C:
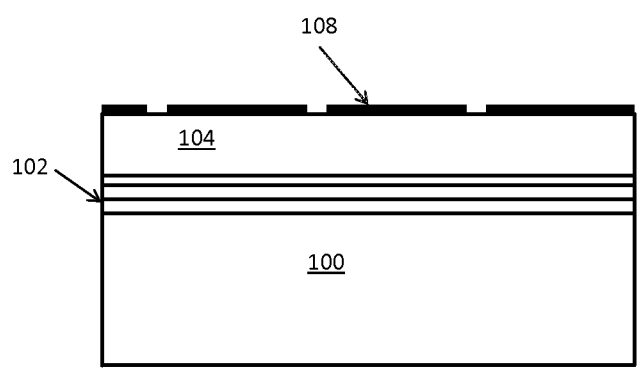

Referring to FIGS. 1A-C, an exemplary semiconductor device is constructed in accordance with an exemplary porous layer and flexible substrate embodiment of the invention. It should be noted that although the various embodiments disclosed herein relate to a solar device, embodiments of the invention are not limited to solar devices and may be used in the construction of various microelectronic and optoelectronic devices. A silicon donor substrate 100 may be used to construct a first portion of a solar cell and a porous region 102 used later for separation. The donor substrate 100 may be doped p+ or n+ or alternately may be more lightly doped if it is illuminated during porous silicon formation. The donor substrate 100 is not limited to silicon and other donor substrates, for example GaAs or Ge, may be used depending on the intended device to be constructed According to the exemplary embodiment, the donor substrate may have resistivity below about 0.1 ohm-cm and a thickness of about 150-1000 microns. The diameter of the donor substrate 100 may be, but is not limited to, standard wafer sizes of 100-300 mm. Alternately, a square substrate may be used, of approximately 5" or 6" on a side, such as is commonly used in crystalline Si solar cells. Dual porous layers of the porous region 102 are formed on the surface of the donor substrate 100. The top porous layer may have a lower porosity, to serve as a template for subsequent epitaxial growth. The bottom porous layer may have a higher porosity, to allow subsequent splitting. An exemplary approach to creating a splitting plane is known in the art and is described in, for example, Yonehara & Sakaguchi, JSAP Int. July 2001, No. 4, pp. 10-16. Details of an exemplary process for forming porous region 102 splitting layers are as follow. A p-type (100)-oriented monocrystalline Si substrate, with resistivity between 0.01-0.02 ohm-cm, may be immersed in a solution composed of one part hydrofluoric acid, one part water, and one part iso-propyl alcohol. The substrate holder is electrically insulating, forcing electrical current to pass through the substrate and not around the wafer periphery. The substrate is in series and in-line with two silicon electrodes, one facing the front of the wafer and the other facing the back. The electrodes are equal to or greater than the diameter of the substrate and are separated from the substrate by a distance of at least 10% of the diameter of the substrate. Two different voltages are applied between the electrodes, resulting in the formation of two different porous silicon layers at different current density. The first layer, which may be etched at a current density of 2-10 mA/cm$^2$ to a depth of 0.5-2 microns (etch time approximately 0.5-5 minutes), is low porosity (approximately 25%). The second layer, buried under the first layer and which may be etched at a current density of 40-200 mA/cm$^2$ to a depth of 0.25-2 microns (etch time approximately 2-30 seconds), is higher porosity. The second layer defines a cleave plane after subsequent cleaning, epitaxy, and bonding, described in further detail below. After etching, the wafers may be immersed in a mixture of sulfuric acid and hydrogen peroxide, self-heating to approximately 80-140° C., for 10 minutes. Other standard semiconductor cleaning solutions, such as SC-1, SC-2, hydrofluoric acid, hydrochloric acid, or iso-propyl alcohol, may also be used.

Referring to FIG. 1B, an n-doped epitaxial silicon film 104 of thickness e.g. 3-20 um, with in-situ doping to give resistivity of e.g. 0.1-5.0 ohm-cm may then be grown on top of the porous region using Atmospheric Pressure Chemical Vapor Deposition (APCVD) or Low Pressure Chemical Vapor Deposition (LPCVD), for example, with precursors such as DCS or TCS, at temperatures from about 700° C. to about 1150° C. Methods of growing high quality epitaxial regions on porous silicon are well known in the art and may involve a step before epitaxial growth to seal the exposed surface pores, such as, for example, an anneal step under an H$^2$ ambient, as described for example in N. Sato at S. Ishii et al, "Reduction of Crystalline defects to 50/cm2 in Epitaxial Layers of Porous Silicon for ELTRAN® Process", in the proceedings of the 1998 IEEE Silicon On Insulator conference. This n-type epitaxial region 104 may comprise the base of the solar cell. The epitaxial growth may start with a thin n+ region 106, e.g. 0.2 microns thick with doping in the range of $2 \times 10^{18}$ cm$^{-3}$. This may later form a Front Surface Field (FSF) and also promote low-resistance contact to the base of the solar cell.

Referring to FIG. 1C, a passivation layer or layers 108 may be grown on the base of the solar cell, with openings for contacts. Passivation Layer(s) 108 may be, for example, thermally grown SiOx, or PECVD-deposited SiNx or SiOxNy. Openings may be produced via, for example, laser ablation as described in A. Grohe et al., "Laser Processes for the Industrial Production of High Efficiency Silicon Solar Cells," Proceedings of the 22nd European Photovoltaic Solar Energy Conference (2007), and P. Engelhart, et al., "Laser Structuring for Back Junction Silicon Solar Cells," Progress in Photovoltaics: Research and Applications, 15 (2007) 237. The layer(s) may be optimized for maximizing reflection. The thickness of passivation layer(s) 108 may be e.g. 5-100 nm. The openings may be, for example but not limited to, trenches (perpendicular to diagram) or circular, square, or rectangular openings. Opening minimum lateral dimension may be e.g. 0.1-10 microns. Spacing between openings may be e.g. 1-10 microns.

Referring to FIG. 1D, aluminum layer 110 may be deposited over the passivation layer and openings 108, for example via screen printing or evaporation. The aluminum layer 110 may be, for example, equal to the thickness of the passivation layer(s) 108 plus additional 0.1-5 microns. An anneal step may be used to allow the aluminum in the opening to react with silicon to form p+ diffusion regions 112 through openings, as described in C. Schmiga, M. Hermle, and S. Glunz, "Towards 20% Efficient N-Type Silicon Solar Cells with Screen-Printed Aluminium-Alloyed Rear Emitter," Proceedings of the 23nd European Photovoltaic Solar Energy Conference (2008). These p+ regions 112 may form the emitter of the solar cell.

Figure 1E:
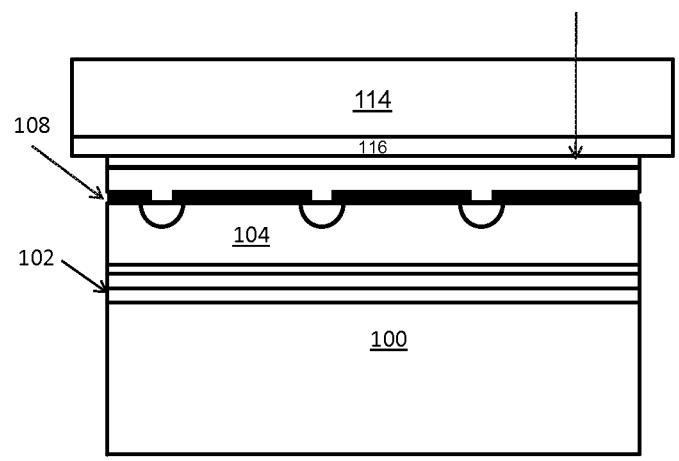
Figure 2:
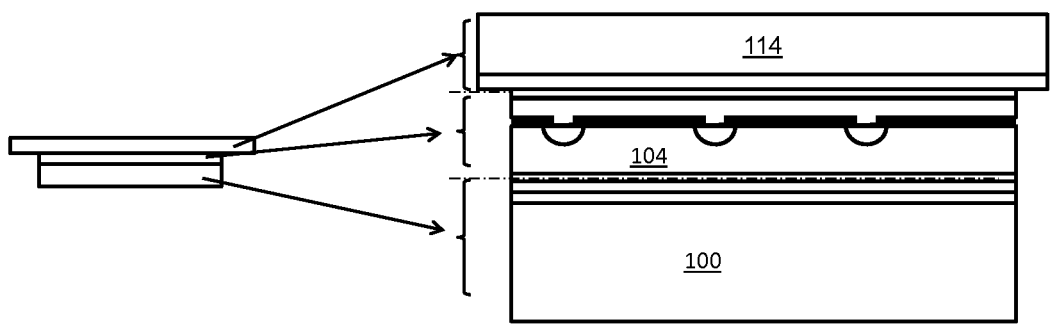
FIG. 2 is a profile diagram of a completed device prior to separation of the substrate constructed in accordance with the exemplary porous layer and flexible substrate embodiment of the invention.

Referring to FIG. 1E, the donor substrate 100 and the partially completed solar cell may be bonded to a flexible substrate 114 such as poly-oxydiphenylene-pyromellitimide or other suitable material. The flexible substrate 114 may be Kapton® brand produced by Dupont. Alternately, a flexible glass substrate such as e.g. Schott Glass Manufacturers D263 borosilicate glass, or Schott Glass Manufacturers BOROFLOAT® 33, of thickness in the range of 50-200 microns could be used. One advantage of using borosilicate glass as a support substrate for a thin Si solar cell is that the CTE can be as low as about 3 ppm/° K. This is relatively close to the values for silicon (about 2.5 ppm/° K) and can results in relatively low temperature-change induced stress in the silicon-on-glass bonded layers. The flexible substrate 114 may be coated with a conductive metal layer 116, for example, copper. The bonding between the constructed portion of the solar cell and the flexible substrate 114 may be provided via an electrically conductive adhesive (ECA). Alternately, the bonding between the portion of the constructed portion of the solar cell and flexible substrate 114 may be provided via solder bonding, e.g. a tin or tin alloy bonding layer. This can be done as follows. First, a thin (e.g. 0.01-1.0 micron) adhesion layer of e.g. Ti or Cr may be evaporated, sputtered, or electroplated on the surface of both the flexible substrate and the surface of the partially completed solar cell which is attached to the Si donor substrate. Second, a solder layer such as pure tin of thickness e.g. 0.1-10 microns can be sputtered, evaporated, or electroplated on the surface of both the flexible substrate and the surface of the partially completed solar cell which is attached to the Si donor substrate. Preferably there may be no or limited exposure of the adhesion layer surface to oxygen containing ambient between the deposition of the adhesion layer and the solder layer. Then, the two solder surfaces can be brought together in a wafer bonder, such as an EVG 520 system, and held under a pressure of e.g. 2-20 atmospheres in a mechanical press while the temperature is raised to above the melting point of the solder, e.g. above 232° C. for the case of a pure tin solder, and held for e.g. 10-60 minutes. In an alternative embodiment, the solder bonding may be performed as just described, but with the solder metal deposited on only one of the flexible substrate and the partially completed solar cell surface. Referring to FIGS. 2 and 3, the correspondence between the simplified schematic (on the left) and the more detailed schematic (on the right) is indicated to illustrate multiple cells or devices mounted on the flexible substrate 114. As previously discussed, providing the silicon donor substrate 100, forming the porous region 102, and constructing a portion of the solar cell may be used repeatedly to produce multiple partially constructed solar cells. These multiple solar cell portions may be bonded to a single flexible substrate 114 to produce a complete solar module. As shown in FIG. 3, a 3×6 array of solar cells is bonded to a single sheet of substrate. It should be understood that such array is not limited to any size or number of solar cells and may be designed based on the intended solar modular to be constructed. The embodiment is not limited to construction of a single solar modular and may also be used to construct multiple solar modules on a single sheet of flexible substrate 114 that may be separated at some point in manufacturing.

Figure 4D:
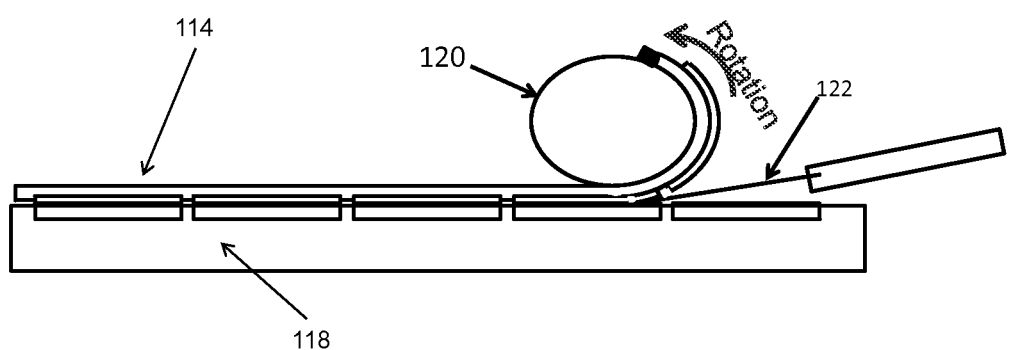

It should be noted that if the above bonding step is done at elevated temperature, such as described for the solder bonding option, the layer may "self-split": i.e., the stress created upon cool down from bonding, due to the CTE mismatch between the flexible substrate 114 and the partially completed solar cell attached to the donor substrate 100, may be enough to cause the partially completed solar cell to split from the donor substrate 100, with the split occurring in the porous silicon region 102. If this is not the case, then referring to FIGS. 4A-D, various exemplary embodiments may be used to separate the portion of the solar cell constructed and flexible substrate 114 from the donor substrate 100 at the porous region 102. In a first embodiment, the flex substrate 114 with bonded cells is brought into contact with a rigid support surface 118. As illustrated, the rigid support surface 118 may have recessed pockets in the size and shape of solar cells. This allows the donor substrate 100 portion of the cells to be seated within the rigid support 118. The pocket depth of the rigid support 118 may be equal to or less than the thickness of donor substrate 100. Various forces may be applied to donor substrate 100 and/or flexible substrate 114 with portions of constructed cell causing the porous region 102 to fracture and split. The forces may be applied by, for example, a horizontal, vertical or shearing force. According to one exemplary embodiment shown in FIGS. 4C and 4D, the flexible substrate 114 may be pealed away from the donor substrate 100. The pealing may be induced via rolling a roller 120 across the back surface, as illustrated. An edge of the flexible substrate 114 may be affixed to the roller 120 via insertion into in a slot machined for that purpose. The roller may 120 then be rolled back onto itself as the flexible substrate 114 and portion of constructed substrate separate from the donor substrate 100.

In conjunction with the rigid support 118, a vacuum or other temporary contact (not shown) may be used to help hold the donor substrate cells in place for the separation process. This may include, for example, temporary adhesives or mechanical coupling. Separation may also be enhanced with various other methods. For example, a wedged device or wire (not shown) may be applied to induce separation at the outer edges of the porous region 102. In another example, a vibration tuned to the porous region 102 may be applied to the donor substrate 100, flexible substrate 114, the roller 120 and/or the wedge device.

In another example, separation may be enhanced via application of a fluid jet 122 directed at the edge of the porous region 102, as described in Yonehara & Sakaguchi. A high pressure water jet may be a horizontal shaped line jet or a pen point that is scanned back and forth across the exposed edge of the porous silicon layers, as the roller 120 or other mechanism slowly separates the donor substrate 100 at the porous region 102. The split may be optimized using various methods as described herein to generally occur at the high porosity region. In yet another example, a wet acid solution, such as HF/H202, may also be exposed to the porous region 102 to add in fracture and separation. It should be understood that the above examples of separation may be used individually or in various combinations.

Referring to FIG. 5, once the flexible substrate 114 and solar cell portion have been removed, additional processing may be performed on the solar cell as is described later herein. Also after splitting, the remaining donor substrates may be processed for reuse in the next wafer production cycle. This processing may include polishing or cleaning of the cleaved surface for subsequent formation of porous layers in future wafer production cycles.

Figure 6:
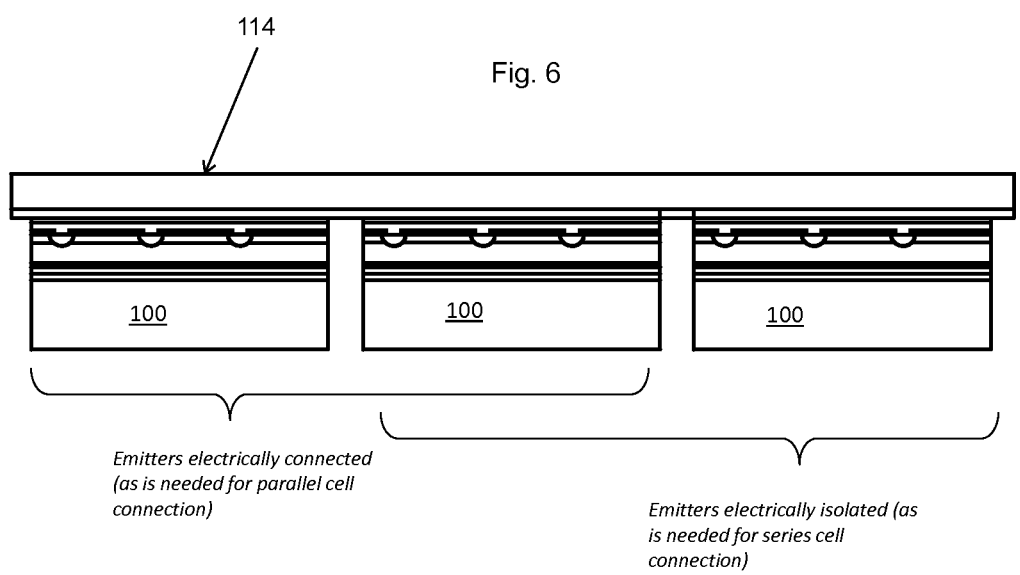
FIG. 6 is a side view diagram of multiple completed devices prior to separation of the substrate constructed in accordance with an exemplary device utilizing a conductive adhesive circuit design to bond to a substrate embodiment of the invention.

Referring to FIG. 6, the metal coating and/or electrically conductive adhesive of the flexible substrate 114 may also be used to serve as electrical connections between the various solar cells on the flexible substrate 114. Depending on whether it is desired to connect adjacent wafers (i.e. adjacent solar cells) in parallel or in series, the metal layer on the flexible substrate 114, which electrically connects the emitter regions of adjacent wafers, can be removed, such as shown below between the middle and right-most wafers. The metal coating and/or electrically conductive adhesive can be laid out on the flexible substrate 114 to provide a circuit design connecting the various solar cells on the flexible substrate 114. The circuit design may be patterned to contacts within and or between the solar cells providing a solar modular circuit design in concert with the front side contacts of the solar cell.

Referring to FIGS. 7A-B, various post-separation processing of the device and/or additional construction of a second portion of the solar cell may occur on the cells coupled to the flexible substrate 114. The subsequent illustrations are focused at the individual cell level to show more detail. The subsequent diagrams are also flipped vertically from previous diagrams. Optionally, the porous layer of the portion of the solar cell may be removed with wet acid etch as described in Yonehara & Sakaguchi, or polished. It may be advantageous to leave the porous layer remains, as the surface's roughness may enhance light capture by the cell. The top surface solar cell processing may also include surface roughening (not shown), surface passivation, anti-reflection coating (not shown) and contacts. It may be desirable to prevent the flexible substrate 114 and the adhesive from experiencing high temperatures—e.g. higher than about 200-400 C. In compliance with this, passivation layer 126 may be, for example, PECVD-deposited SiNx or amorphous-Si as described in W. L. F. Chen, PECVD Silicon Nitride for n-Type Silicon Solar Cells, Ph.D. Thesis, University of New South Wales (2008) and Y. Tsunomura, et al., "Twenty-Two Percent Efficiency HIT Solar Cell," Solar Energy Materials and Solar Cells 93 (2009) 670. Contacts 128 may, for example, be screen printed followed by laser firing instead of furnace fired as described in E. Schneiderlöchner, R. Preu, R. Lüdemann, and S. W. Glunz, "Laser-Fired Rear Contacts for Crystalline Silicon Solar Cells," Progress in Photovoltaics: Research and Applications 10 (2002) 29.

Figure 8:
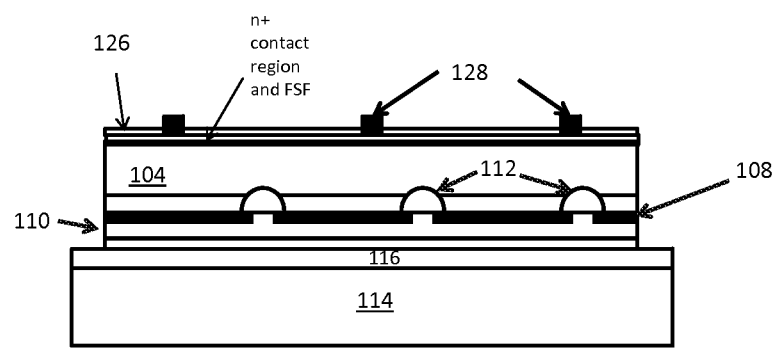
FIG. 8 is a profile diagram of an exemplary completed device in accordance with the exemplary porous layer and flexible substrate embodiment of the invention.

Referring to FIG. 8, each cell on the flexible substrate 114 may have the exemplary basic cell structure. After topside wiring for cell interconnect, the cells and/or flexible substrate 114 may be covered with a protective polymer film such as EVA—not shown. It should be noted that the solar cell structure is for illustrative purposes and the invention is not limited to the disclosed structure. Various devices may be constructed and materials can be deposited by a variety of techniques, including thermal or e-beam evaporation, DC or RF sputtering, electroplating, molecular beam epitaxy (MBE), atomic layer deposition (ALD), pulsed-laser deposition (PLD), spin coating, MOCVD, HVPE, liquid phase epitaxy (LPE), screen printing, or any other suitable technique. Materials can be annealed or undergo chemical reactions following deposition, or after additional materials or reactants are deposited or placed in proximity.

Figure 9:
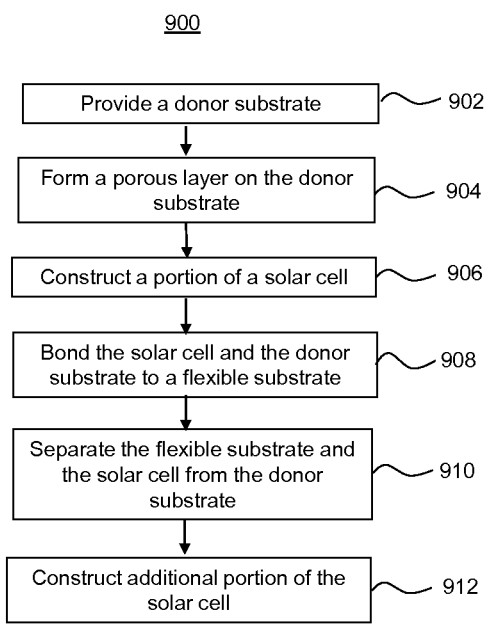
FIG. 9 is a flow chart of exemplary actions used to construct a device in accordance with the exemplary porous layer and flexible substrate embodiment of the invention.

Referring to FIG. 9, construction of the exemplary porous region and flexible substrate device 900 may include the following actions. The donor substrate 100 is provided (block 902). One or more porous layers 102 are formed on the donor substrate 100 (block 904). A solar cell or device is constructed or partially constructed on top of the porous layer 102 of the donor substrate 100 (block 906). The solar cell or device and donor substrate 100 are bonded to the flexible substrate 114 (block 908). The solar cells or devices and flexible substrate 114 are removed from the donor substrate (block 910). The flexible sheets of solar cells or devices are processed further to completion (block 912) and the separated donor substrates are processed for recycling.

Figure 10:
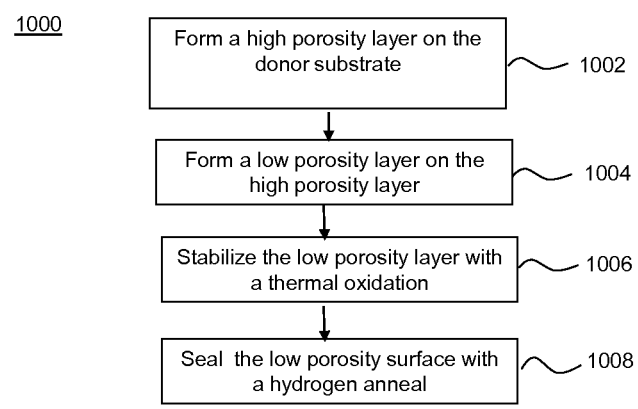
FIG. 10 is a flow chart of exemplary actions used to construct a porous layer or layers in accordance with the exemplary porous layer and flexible substrate embodiment of the invention.

Referring to FIG. 10, construction of the exemplary porous layer(s) 1000 may include the following actions. A layer of high porosity is formed on the donor substrate (block 1002). A layer of low porosity is formed on the donor substrate (block 1004). The layer of low porosity may be stabilized with a thermal oxidation to a template for subsequent device construction (block 1006). The low porosity layer may also be annealed in a hydrogen atmosphere to further aid in subsequent device construction (block 1008). The porous region 102 is not limited to two layers. Embodiments may include a single porous layer or more layers may be used to provide cleaving at a desired point of separation. For example, a region of high porosity may be sandwiched between two layers of lower porosity.

Figure 11:
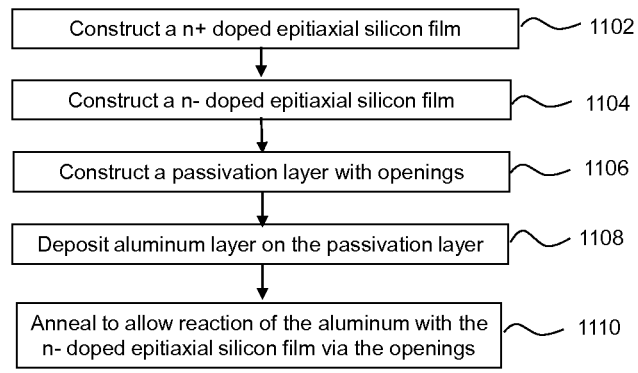
FIG. 11 is a flow chart of exemplary actions used to construct a porous solar cell device in accordance with the exemplary porous layer and flexible substrate embodiment of the invention.
Figure 12A:
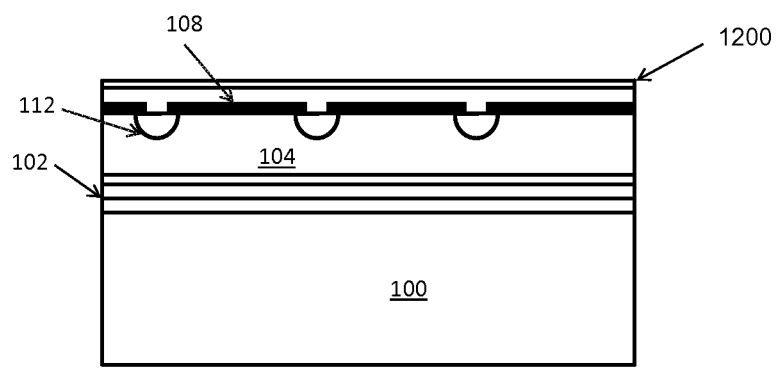
Figure 12B:
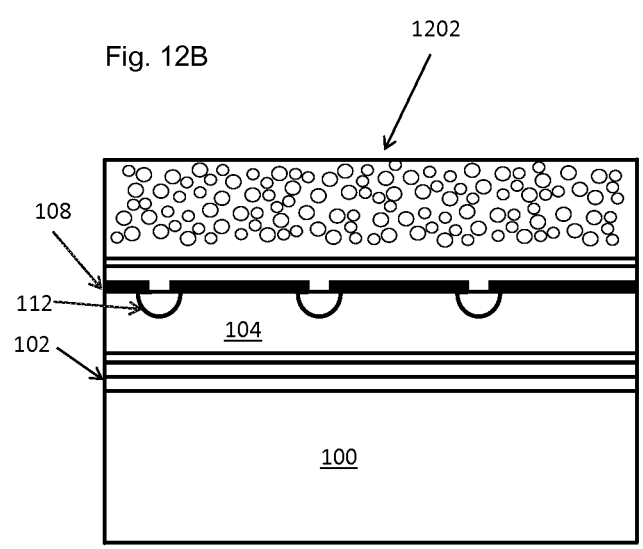

Referring to FIG. 11, construction of the exemplary first portion of a solar cell 1100 may include the following actions. An n+ doped epitaxial silicon film is provided on the low porosity template layer of the donor substrate (block 1102). An n– doped silicon film is provided on top of the n+ doped epitaxial silicon film (block 1104). A passivation layer is provided with openings to later construct the emitters of the cell (block 1106). A layer of Aluminum is deposited on the passivation layer (block 1108). An anneal of the structure is provided to allow the aluminum to react with the n– doped silicon film and form the emitters of the cell (block 1110). Embodiments are not limited to the above structure and may include various additional layers and features.

Referring to FIG. 12A-D, an exemplary semiconductor device is constructed in accordance with an exemplary metal/composite plated substrate embodiment of the invention. It should be noted that although the various embodiments disclosed herein relate to a solar device, embodiments of the invention are not limited to solar devices and may be used in the construction of various microelectronic and optoelectronic devices. A portion of the solar cell is constructed as previously described with regard to FIGS. 1A-D. A plating seed layer 1200 may be deposited on the top surface of the solar cell. The seed layer 1200 may be, for example, a thin (e.g 10-100 nm) layer of Pd. Using electro- or electroless plating, a metal film 1202 such as nickel or copper is deposited on the metal seed layer. This film may serve as the carrier for the thin silicon solar cell. It may be necessary to do composite plating—e.g. plating with inclusion of small (10 nm-10 um) particles such as amorphous silica, graphite fibers or other material, to reduce the CTE of the plated film. Methods for composite plating are known in the metal finishing industry, e.g. for creating films with high wear resistance.

For this application, a target CTE of below 5 ppm/° K may allow subsequent thermal steps of up to around 700° C. without cracking of the silicon solar cell layers. Nickel plating with about 50% silica particles (by volume) may provide a CTE in this range. It may be preferable to have the CTE even lower, nearly matching that of silicon. Copper with graphite fibers incorporated to a volume fraction of about 40% may be used to provide a CTE closely matching silicon. Such alloys are described in publication by MMCC: http://www.mmc-cinc.com/graphitereinforcedalcu.pdf. The plated film may have a thickness of, for example, 50-500 microns.

The solar cell and metal/composite plating 1202 may be separated from the donor substrate 100 at the porous region 102. Various exemplary embodiments and combinations of enhancements may be used to separate the donor substrate 100 at the porous region 102 as previously described with regard to FIGS. 4A-D. An additional anneal step may be used to induce CTE stress in the wafer stack, which may promote splitting within the porous layer.

Referring to FIG. 12D, various post-separation processing and device construction of the device may occur on the cells coupled to the metal/composite substrate. The diagram is also flipped vertically from previous diagrams. The top surface solar cell processing may also include surface roughening (not shown), surface passivation, anti-reflection coating (not shown) and contacts as previously described with regard to FIGS. 7A-B. In this embodiment, front-side processing temperatures may be limited by thermal strain considerations. For example, if the CTE of the substrate is about 2-2.5 ppm higher than silicon, and the silicon film thickness is about 5 microns, temperatures for front-side processing should be limited to about 700 C. to avoid silicon film cracking.

Figure 13:
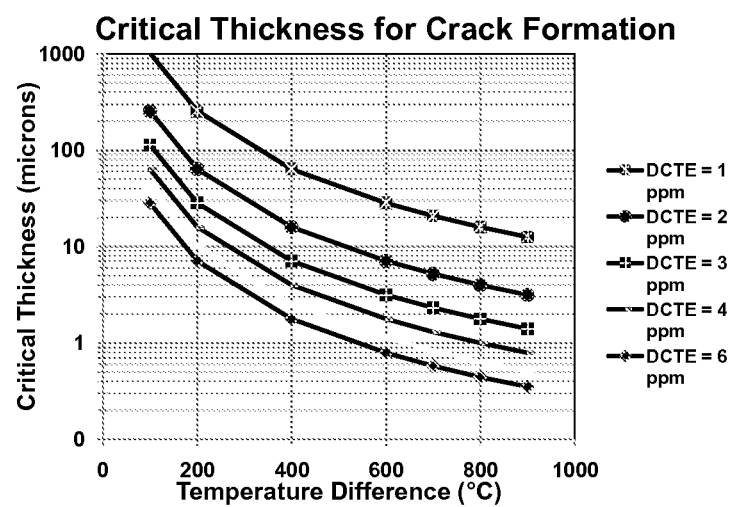
FIG. 13 is a chart that illustrates the difference in CTE of substrate and monocrystalline film versus monocrystalline film thickness in accordance with the exemplary metal/composite plated substrate embodiment of the invention.

Referring to FIG. 13, the graph illustrates the difference in CTE of substrate and monocrystalline film versus monocrystalline film thickness. To limit crack formation, post-split processing temperatures may need to be limited according to: (a) the difference in CTE ("DCTE") between the support layer (i.e. the electroplated carrier) and the monocrystalline silicon film, and (b) the monocrystalline silicon film thickness. For example, per the figure below, based on thin film cracking theory presented in V. K. Yang, et al., "Crack Formation in GaAs Heteroepitaxial Films on Si and SiGe Virtual Substrates," Applied Physics Letters 93 (2003) 3859, a DCTE of 2 ppm and a silicon film thickness of 5 microns may allow processing up to about 700 C. without cracking A DCTE of 1 ppm and a silicon film thickness of 10 microns may allow processing over 900 C.

Figure 14:
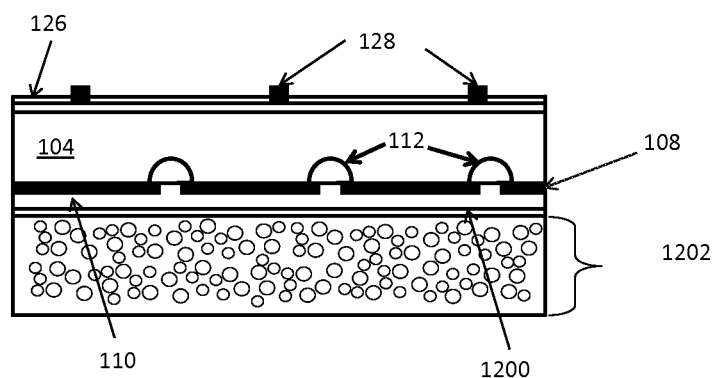
FIG. 14 is a profile diagram of an exemplary completed device in accordance with the exemplary metal/composite plated substrate embodiment of the invention.

Referring to FIG. 14, after topside wiring for cell interconnect, the cells and/or metal/composite film may be covered with a protective polymer film such as EVA—not shown. The electroplated metal support layer may allow for significant flexibility of the cell. The electroplated metal support layer may also be used to couple multiple solar cells to provide a flexible solar module of cells. The embodiment can be compatible with standard module fabrication methods. It should be noted that the solar cell structure is for illustrative purposes and the invention is not limited to the disclosed structure. Various devices may be constructed/substituted and materials can be deposited by a variety of techniques, including thermal or e-beam evaporation, DC or RF sputtering, electroplating, molecular beam epitaxy (MBE), atomic layer deposition (ALD), pulsed-laser deposition (PLD), spin coating, MOCVD, HVPE, liquid phase epitaxy (LPE), screen printing, or any other suitable technique. Materials can be annealed or undergo chemical reactions following deposition, or after additional materials or reactants are deposited or placed in proximity.

Figure 15:
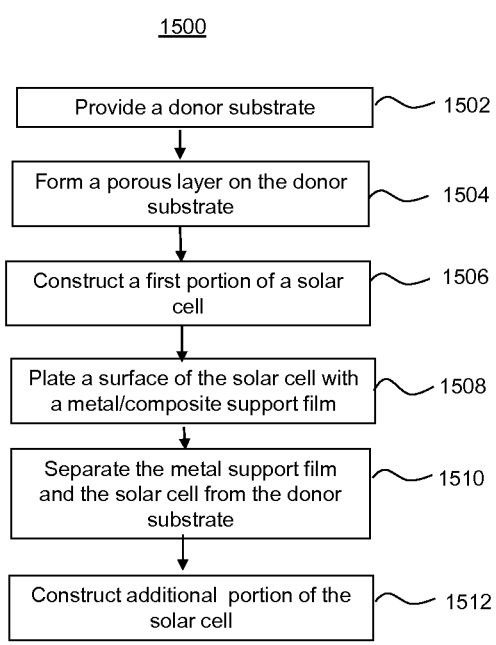
FIG. 15 is a flow chart of exemplary actions used to construct a device in accordance with the exemplary metal/composite plated substrate embodiment of the invention.
Figure 16A:
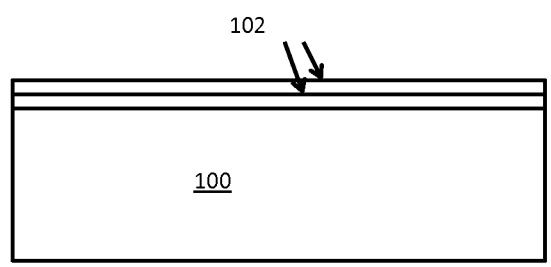
Figure 16B:
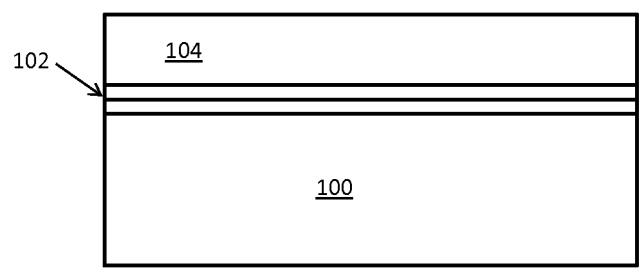
Figure 16C:
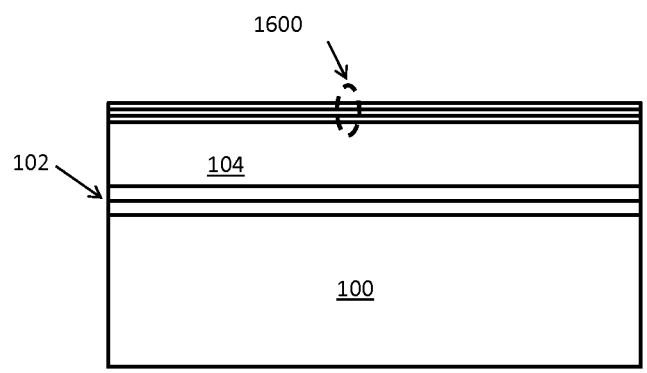
Figure 16D:
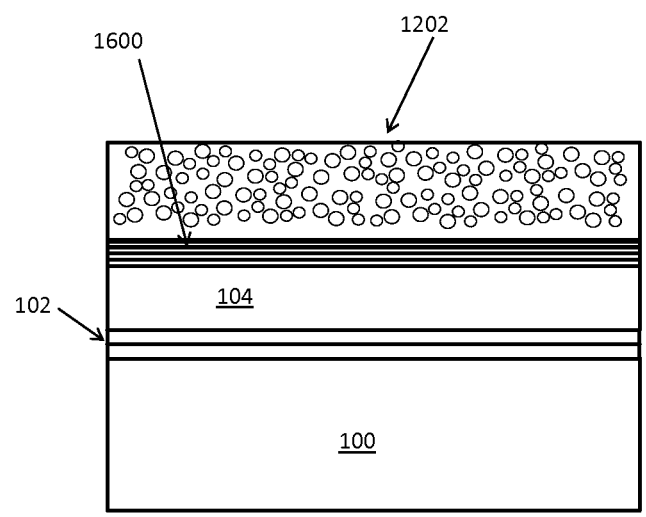
Figure 16F:
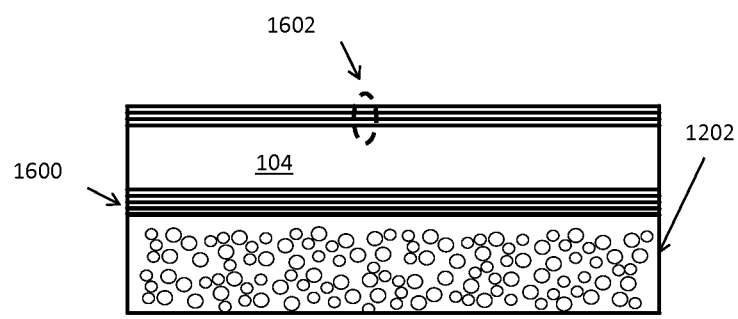
Figure 16G:
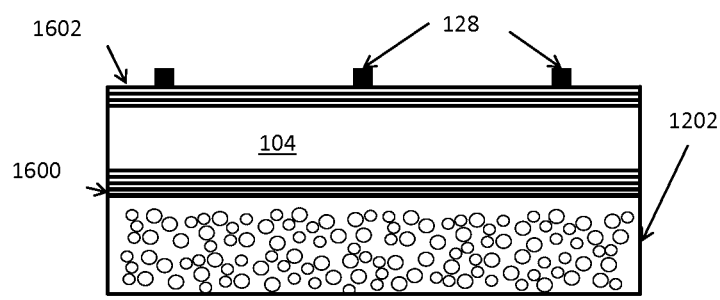
Figure 16H:
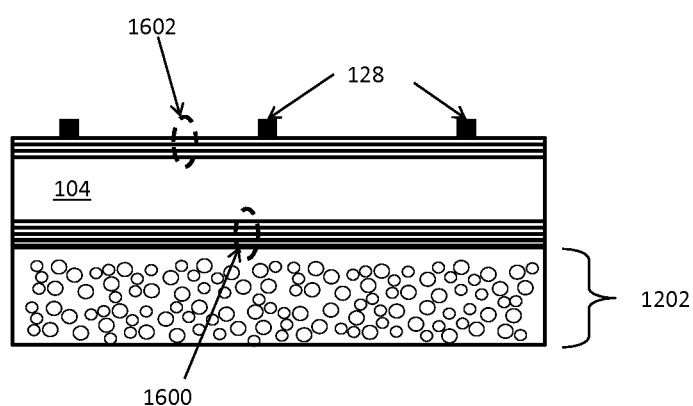

Referring to FIG. 15, construction of the exemplary porous layer and metal/composite support device 1500 may include the following actions. The donor substrate 100 is provided (block 1502). One or more porous layers 102 are formed on the donor substrate 100 (block 1504). A solar cell or device is constructed or partially constructed on top of the porous layer 102 of the donor substrate 100 (block 1506). The solar cell or device and donor substrate 100 are plated with a metal/composite support film 1202 (block 1508). The solar cells or devices and metal/composite support film 102 are removed from the donor substrate 100 (block 1510). The solar cells or devices are processed further to completion (block 1512) and the separated donor substrates are processed for recycling.

Referring to FIG. 16A-H, an exemplary Heterojunction with Intrinsic Thin layer (HIT) solar device is constructed in accordance with an exemplary metal/composite plated substrate embodiment of the invention. A portion of the base region of the solar cell is constructed as previously described with regard to FIGS. 1A-B. A first side of HIT solar cell 1600 may be constructed on n-type base 104 of the solar cell. This may be performed using a turnkey commercial system that is available, for example, from Roth & Rau, offering 21% efficiency. The first side of the HIT solar call 1600 may involve deposition of a-Si:H(i)*, for example, by PECVD, T=5-10 nm, deposition of a-Si:H(n), for example, by PECVD, T=5-10 nm, and optionally, deposition of a TCO (transparent conductive oxide) such as ITO (Indium Tin Oxide) to a thickness of 5-10 nm. The deposition for all these layers may be around 200 degrees C. or lower.

A plating seed layer 1200 may be deposited on the top surface of one side of the HIT solar cell 106. The seed layer 1200 may be, for example, a thin (e.g 10-100 nm) layer of Pd. Using electro- or electroless plating, a metal film 1202 such as nickel or copper is deposited on the metal seed layer 1200. This film 1202 may serve as the carrier for the thin silicon solar cell. It may be necessary to do composite plating—e.g. plating with inclusion of small (10 nm-10 um) particles such as amorphous silica, graphite fibers or other material, to reduce the CTE of the plated film. Methods for composite plating are known in the metal finishing industry, e.g. for creating films with high wear resistance.

For this application, a target CTE of below 10 ppm/° K may allow subsequent thermal steps of up to around 200° C. without cracking of the silicon solar cell layers. Nickel plating with about 15-35% silica particles (by volume) may provide a CTE in this range. The plated film 1202 may have a thickness of, for example, 50-500 microns. After splitting, the porous layers 102 can be removed from both surfaces by a wet etch, e.g. HF:H2O2 as previously described. Alternately, some or all of the porous layer(s) 102 may be left on the epitaxial layer surface, to provide "built in" roughening, which may be valuable for light trapping. The donor substrate 100 can then be recycled for future cell production.

A second side of HIT solar cell 1602 may be constructed on the porous layer 102. This may be performed using the same turnkey commercial system(s) as previously described. The second side of the HIT solar call 1602 may involve deposition of a-Si:H(i)*, for example, by PECVD, T=5-10 nm, deposition of a-Si:H(n), for example, by PECVD, T=5-10 nm, and optionally, deposition of a TCO (transparent conductive oxide) such as ITO (Indium Tin Oxide) to a thickness of 5-10 nm. The deposition for all these layers may be around 200 degrees C. or lower. Deposited topside contacts 128 may be accomplished via screen printing of self-drying Ag paste (requiring little or no anneal). Alternately, this step could be performed before the TCO deposition. After topside wiring for cell interconnect, the cells and/or metal/composite film (not shown) may be covered with a protective polymer film such as EVA. The electroplated metal support layer 1202 and/or 1200 may allow for significant flexibility of the cell.

Figure 17:
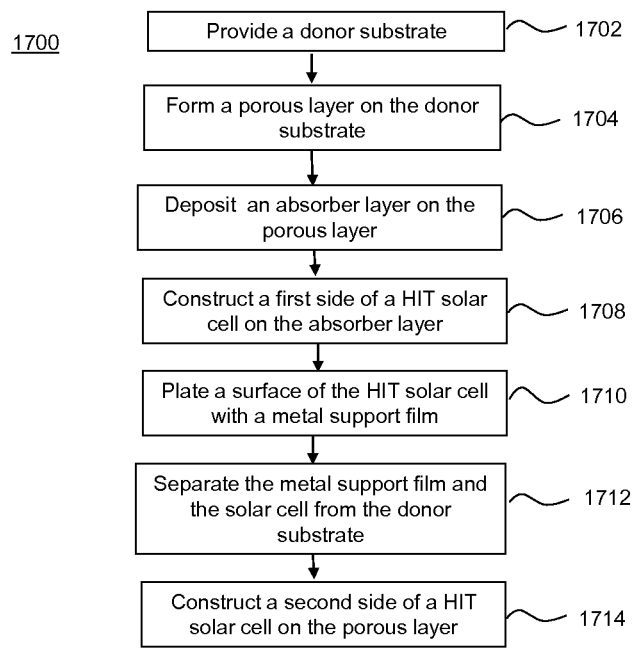
FIG. 17 is a flow chart of exemplary actions used to construct the HIT solar device in accordance with the exemplary HIT solar device utilizing ion implant and a metal/composite plated substrate embodiment of the invention.

Referring to FIG. 17, construction of the exemplary HIT solar cell on a porous layer 102 and metal/composite support 1700 may include the following actions. The donor substrate 100 is provided (block 1702). One or more porous layers 102 are formed on the donor substrate 100 (block 1704). An absorber layer or base region 104 is deposited on the porous layer 102 (block 1706). A first side of a HIT solar cell 1600 is constructed on top of the porous layer 102 of the donor substrate 100 (block 1708). The partially constructed solar cell and donor substrate 100 are plated with a metal/composite support film 1200 and/or 1202 (block 1710). The partially constructed solar cells and metal/composite support film 1200 and/or 1202 are removed from the donor substrate 100 (block 1712). A second side of a HIT solar cell 1600 is constructed on top of the split porous layer 102 (block 1714). The HIT solar cell 1600 is processed further to completion and the separated donor substrate may be processed for recycling.

Figure 18:
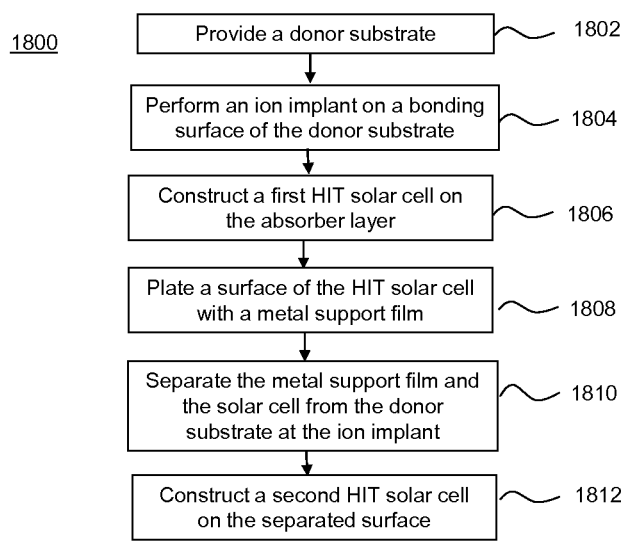
FIG. 18 is a flow chart of exemplary actions used to construct the HIT solar device in accordance with an exemplary HIT solar device utilizing a porous region and a metal/composite plated substrate embodiment of the invention.

Referring to FIG. 18, construction of the exemplary HIT solar cell on an ion implant and metal/composite support 1800 may include the following actions. The donor substrate 100 is provided (block 1802). An ion implant is performed on a surface of the donor substrate 100 (block 1804). The ion implant forms a cleave plane at a depth of e.g. 5-10 microns in the donor substrate, via implantation of H+ ions, with energy in the range of 500-1000 KeV and dose in range of 5e16-2e17 $cm^{-2}$. Dose may need to be carefully selected to avoid cleave temperature in the range of 250-300 C. Too low of a cleaving temperature may prohibit subsequent cell processing without premature cleaving. Too high of a cleaving temperature may damage the amorphous cell layers to be introduced before cleaving. A first side of a HIT solar cell 1600 may be constructed on top of the ion implant surface of the donor substrate (block 1806). The partially constructed HIT solar cell 1600 and donor substrate 100 are plated with a metal/composite support film 1200 and/or 1202 (block 1808). The partially constructed solar cells and metal/composite support film 1200 and/or 1202 are removed from the donor substrate 100 (block 1810). A second side of a HIT solar cell 1600 is constructed on top of the ion split donor film opposite the first side of the HIT solar cell 1600 (block 1812). The HIT solar cell is processed further to completion and the separated donor substrate may be processed for recycling.

Figure 19:
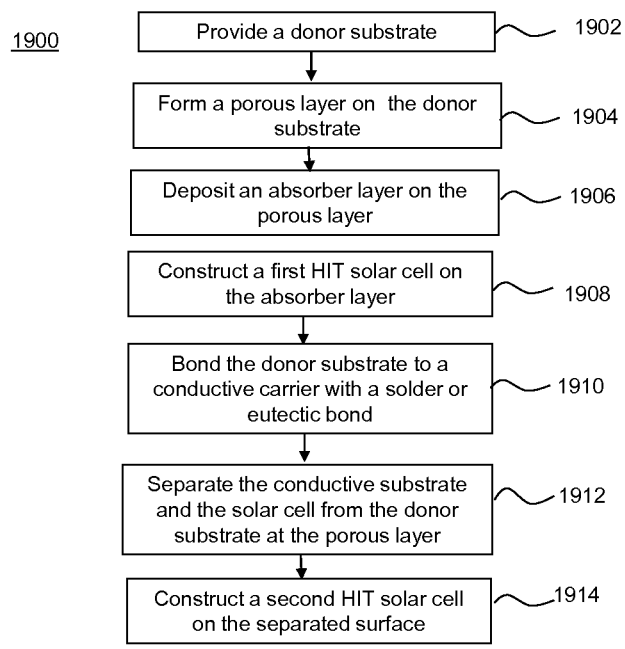
FIG. 19 is a flow chart of exemplary actions used to construct the HIT solar device in accordance with an exemplary HIT solar device utilizing a porous region with solder or eutectic bonding to a conductive substrate embodiment of the invention.

Referring to FIG. 19, construction of the exemplary HIT solar cell on a donor substrate with porous layer 1900 may include the following actions. The donor substrate 100 is provided as previously illustrated and described in prior embodiments (block 1902). One or more porous layers 102 are formed on the donor substrate 100 as previously illustrated and described in prior embodiments (block 1904). An absorber layer or base region 104 is deposited on the porous layer 102 (block 1906). A first side of a HIT solar cell 1600 is constructed on top of the porous layer 102 of the absorber layer (block 1908). The donor substrate 100 is soldered or eutecticly bonded to conductive carrier substrate (block 1910). The deposited eutectic or solder bonding stack may need to be designed for peak bonding temperatures in the range of 250-300 C, and post-bond stability up to 200 C. The conductive carrier substrate may be a low cost material, for example, tape cast poly-AlN or TiN. The conductive carrier substrate may also have a target CTE selected to prevent and allow subsequent processing temperatures without cracking of the silicon solar cell layers. It may be preferable to have the CTE nearly matching that of silicon. The partially constructed HIT solar cells 1600 and conductive carrier are removed from the donor substrate 100 (block 1912). A second side of a HIT solar cell 1600 is constructed on top of the split donor film opposite the first side of the HIT solar cell 1600 (block 1914). The HIT solar cell is processed further to completion and the separated donor substrate may be processed for recycling.

The foregoing description, for purposes of explanation, used specific nomenclature to provide a thorough understanding of the invention. However, it will be apparent to one skilled in the art that the specific details are not required in order to practice the invention. Thus, the foregoing descriptions of specific embodiments of this invention are presented for purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications. These procedures will enable others, skilled in the art, to best utilize the invention and various embodiments with various modifications. It is intended that the scope of the invention be defined by the following claims and their equivalents. Modifications and substitutions by one of ordinary skill in the art are considered to be within the scope of the present invention, which is not to be limited except by the following claims.

The invention claimed is:

1. A method of solar cell construction, the method comprising:
providing a silicon donor substrate;
forming a porous layer on the silicon donor substrate;
constructing a first portion of a solar cell on the porous layer of the silicon donor substrate wherein the action of constructing the first portion of the solar cell further comprises the actions of:
producing a n+ doped epitaxial layer;
producing a n- doped epitaxial silicon film on the n+ doped epitaxial silicon film;
producing a passivation layer with openings on top of the n- doped epitaxial silicon film;
depositing aluminum on the passivation layer; and
annealing to allow reaction of the aluminum with the n- doped epitaxial silicon film via the openings;
bonding the first portion of the solar cell to a flexible substrate;
separating the flexible substrate and the first portion of the solar cell from the silicon donor substrate at the porous layer; and
constructing a second portion of the solar cell on the first portion of the solar cell.

2. The method of claim 1, wherein the silicon donor substrate is p+ with a resistivity below 0.1 ohm-cm and a thickness of about 150-1000 microns.

3. The method of claim 1, wherein the action of forming the porous layer further comprises producing a first low porosity layer to serve as a template for constructing the first portion of the solar cell, and a high porosity layer at which the action of separating the flexible substrate and the first portion of the solar cell from the silicon donor substrate occurs.

4. The method of claim 1, wherein the action of constructing the first portion of the solar cell further comprises producing a n+ doped epitaxial silicon film on the porous layer with doping in the range of about $2 \times 10^{18}$ cm$^{-3}$.

5. The method of claim 1, wherein the action of constructing the first portion of the solar cell further comprises producing a n+ doped epitaxial silicon film on the porous layer with a thickness of about 0.2 microns.

6. The method of claim 5, wherein the action of constructing the first portion of the solar cell further comprises producing a n- doped epitaxial silicon film with doping in the range of about 0.5-2.0 ohm-cm on the n+ doped epitaxial silicon film.

7. The method of claim 5, wherein the action of constructing the first portion of the solar cell further comprises producing a n- doped epitaxial silicon film with a thickness of about 3-20 microns cm on the n+ doped epitaxial silicon film.

8. The method of claim 1, wherein the flexible substrate is poly-oxydiphenylene-pyromellitimide.

9. The method of claim 1, wherein the action of bonding the first portion of the solar cell to the flexible substrate; comprises the action of:
coating a bonding surface of the flexible substrate with a metal layer and
forming an electrical bond with a bonding surface of the first portion of the solar cell and the metal layer.

10. The method of claim 9, wherein the coating with the metal layer produces a circuit design electrically connecting multiple solar cells.

11. The method of claim 10, further comprises the action of:
providing metal contacts on a split surface of the first portion of the solar cell wherein both the metal contacts and the metal layer produce the circuit design.

12. The method of claim 1, wherein the actions of providing the silicon donor substrate, forming the porous layer, and constructing the first portion of the solar cell produce multiple first portions of solar cells and the multiple first portions of solar cells are bonded to the flexible substrate to produce part of a solar module.

13. The method of claim 1, further comprises the action of:
coupling the first portion of the solar cell to a rigid support structure; and
flexing the flexible substrate causing the action of separating the flexible substrate and the first portion of the solar cell from the silicon donor substrate at the porous layer.

14. The method of claim 13, wherein the action of coupling involves creating a vacuum with a surface of the first portion of the solar cell opposite a bonded surface of the first portion of the solar cell.

15. The method of claim 13, wherein the action of coupling involves creating a temporary mechanical attachment with a surface of the first portion of the solar cell opposite a bonded surface of the first portion of the solar cell.

16. The method of claim 13, wherein the rigid support structure receives both a bottom surface and side surfaces of the first portion of the solar cell.

17. The method of claim 13, wherein flexing the flexible substrate involves coupling an edge of the flexible substrate to a roller and rotating the roller to peel back the flexible substrate and cause separation at the porous layer.

18. The method of claim 13, wherein the action of separating the flexible substrate and the first portion of the solar cell from the silicon donor substrate further comprises directing a fluid jet at an edge of the porous layer.

19. The method of claim 13, wherein the action of separating the flexible substrate and the first portion of the solar cell from the silicon donor substrate further comprises exposing a wets acid solution to an edge of the porous layer.

20. The method of claim 1, further comprises the action of: resurfacing a surface of the silicon donor substrate for reuse as a silicon donor substrate for another solar cell construction.

21. The method of claim 1, further comprises the action of: removing a residual porous layer from a split surface of the first portion of the solar cell.

22. The method of claim 1, further comprises the action of: providing metal contacts on a split surface of the first portion of the solar cell.

23. The method of claim 1, further comprises the action of: providing surface passivation on a split surface of the first portion of the solar cell.

24. The method of claim 1, further comprises the action of: providing an anti-reflection coating on a split surface of the first portion of the solar cell.

25. The method of claim 1, further comprises the action of: providing a protective polymer coating on a split surface of the first portion of the solar cell.

26. The method of claim 1, wherein the flexible substrate is borosilicate glass.

27. The method of claim 1, wherein the flexible substrate has a coefficient of thermal expansion less than 5 ppm/° K.

* * * * *